United States Patent
Seet et al.

(10) Patent No.: US 7,294,241 B2
(45) Date of Patent: Nov. 13, 2007

(54) METHOD TO FORM ALPHA PHASE TA AND ITS APPLICATION TO IC MANUFACTURING

(75) Inventors: Chim Seng Seet, Singapore (SG); Bei Chao Zhang, Singapore (SG); San Leong Liew, Singapore (SG); John Sudijono, Singapore (SG); Lai Lin Clare Yong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 392 days.

(21) Appl. No.: 10/336,271

(22) Filed: Jan. 3, 2003

(65) Prior Publication Data
US 2004/0131878 A1    Jul. 8, 2004

(51) Int. Cl.
*C23C 14/34* (2006.01)
*H01L 21/44* (2006.01)

(52) U.S. Cl. ............... 204/192.17; 204/192.12; 438/656; 438/648; 438/687; 438/582

(58) Field of Classification Search .......... 204/192.12, 204/192.17, 192.21; 438/582, 648, 656; 458/687
See application file for complete search history.

(56) References Cited

U.S. PATENT DOCUMENTS

| | | | |
|---|---|---|---|
| 5,221,449 A | 6/1993 | Colgan et al. | |
| 5,281,485 A | 1/1994 | Colgan et al. | |
| 6,121,149 A | 9/2000 | Lukanc et al. | |
| 6,221,757 B1 | 4/2001 | Schmidbauer et al. | 438/625 |
| 6,251,528 B1 * | 6/2001 | Uzoh et al. | 428/587 |
| 6,287,977 B1 * | 9/2001 | Hashim et al. | 438/722 |
| 6,291,885 B1 | 9/2001 | Cabral, Jr. et al. | 257/751 |
| 6,297,140 B1 | 10/2001 | Uzoh et al. | 438/612 |
| 6,339,258 B1 * | 1/2002 | Cooney, III et al. | 257/762 |
| 6,375,743 B2 * | 4/2002 | Sundarrajan et al. | 118/697 |
| 6,395,148 B1 * | 5/2002 | Whitman | 204/192.15 |

(Continued)

FOREIGN PATENT DOCUMENTS

| | | |
|---|---|---|
| EP | 1 083 596 A1 | 3/2001 |
| WO | WO 02/065547 A2 | 8/2002 |

OTHER PUBLICATIONS

Catania et al. "Low resistivity body-centered cubic tantalum thin films as diffusion barriers between copper and silicon", J.Vac. Sci. Technol. A 10(5), Sep./Oct. 1992 pp. 3318-3321.*

(Continued)

*Primary Examiner*—Rodney G. McDonald
(74) *Attorney, Agent, or Firm*—William J. Stoffel (57) ABSTRACT

A method of sputtering a Ta layer comprised of alpha phase Ta on a Cu layer. An embodiment includes a Ta sputter deposition on a Cu surface at a substrate temperature less than 200° C. Another embodiment has a pre-cooling step at a temperature less than 100° C. prior to Ta layer sputter deposition. In another non-limiting example embodiment, a pre-clean step comprising an inert gas sputter is performed prior to the tantalum sputter. Another non-limiting example embodiment provides a semiconductor structure comprising: a semiconductor structure; a copper layer over the semiconductor structure; a tantalum layer on the copper layer; the tantalum layer comprised alpha phase Ta; a metal layer on the tantalum layer.

26 Claims, 9 Drawing Sheets

U.S. PATENT DOCUMENTS 6,458,255 B2 * 10/2002 Chiang et al. ......... 204/192.15
6,764,940 B1 * 7/2004 Rozbicki et al. ............ 438/627
6,860,975 B2 * 3/2005 Donohue et al. ........ 204/192.3
6,908,865 B2 * 6/2005 Kranz et al. ................ 438/710

OTHER PUBLICATIONS

Feinstien and Hutteman, "Factors controlling the structure o sputtered TA films", Thin Solid Films 16 (1975), pp. 129-145 (best copy attached).

* cited by examiner

METHOD TO FORM ALPHA PHASE TA AND ITS APPLICATION TO IC MANUFACTURING

BACKGROUND OF INVENTION

1) Field of the Invention

This invention relates generally to fabrication of semiconductor devices, and to the fabrication of metal layers comprised of alpha phase Tantalum (Ta) and more particularly to Ta layers comprised of alpha and beta phase tantalum.

2) Description of the Prior Art

As ultra-large scale integrated (ULSI) devices extend into deep submicron generations, new interconnect schemes and materials are essential to drive performance and reliability. Owing to its lower bulk electrical resistivity (1.7-2.2 microohm-cm) and higher electromigration resistance, copper has begun to displace aluminum as the interconnect material of choice. Nonetheless, copper is a fast migrating species in silicon based devices, and its inherent chemical reactivity renders it susceptible to oxidation and corrosion. Hence, encapsulation of the copper is essential, and a conductive barrier should be a suitable encapsulant that can act both as an effective barrier to copper diffusion and an adhesion promoter to the surrounding dielectrics while maintaining the overall performance. Tantalum and its related compounds such as tantalum nitride and tantalum silicon nitride have attracted much attention to their role as copper diffusion barriers. Being a refractory metal, tantalum is also relatively immiscible with copper, and is thus an excellent barrier material for ULSI applications. However, better methods and structures for forming interconnects with Ta barrier layer are needed.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,339,258b1 (Cooney, III et al.) shows a tantalum layer.

U.S. Pat. No. 6,221,757b1 (Schmidbauer et al.) shows a method of making microelectronic structures using a tantalum.

U.S. Pat. No. 6,297,140b1 (Uzoh et al.) shows a method for a Cu stud that involves a barrier layer.

U.S. Pat. No. 6,291,885b1 (Cabral, Jr. et al.) discusses a multi-layer of TaN and Ta as a barrier layer.

U.S. Pat. No. 6,251,528b1 (Uzoh) shows a method shows a method for a Cu stud that involves a barrier layer.

U.S. Pat. No. 6,362,027(Yamazaki et al.) shows an interconnect with a Ta layer.

FACTORS CONTROLLING THE STRUCTURE OF SPUTTERED TA FILMS, by G. Feinstein and R. D. Huttermann, Thin Solid films, Vol. 16, pages 129-145 (1973) shows beta phase Ta processes.

SUMMARY OF THE INVENTION

It is an object of an embodiment of the present invention to provide a method for fabricating a Ta film comprised of Alpha phase Ta.

It is an object of an embodiment of the present invention to provide a method for fabricating a Ta film comprised of alpha phase Ta on a copper film.

It is an object of an embodiment of the present invention to provide a method for fabricating a Ta film comprised of alpha phase Ta and Beta phase Ta on a copper film.

It is an object of an embodiment of the present invention to provide a structure for a semiconductor device having a Ta film comprised of alpha phase Ta on a copper film.

An embodiment of the invention provides a method of sputtering a tantalum (Ta) layer comprised of alpha phase Ta on a copper (Cu) layer. The embodiment comprises a low temperature Ta sputter step to form a tantalum (Ta) layer comprised of alpha Ta and beta Ta. An embodiment includes a pre-cooling step at a temperature less than about 200° C. prior to Ta sputter deposition. An embodiment includes a pre-clean step to clean the copper surface prior to the Ta sputter.

The present invention provides a first non-limiting example embodiment which can be characterized as follows. A Cu layer is formed over a substrate. The Cu layer has an exposed Cu surface. In a Ta sputtering step, we form a tantalum layer on the Cu Layer at a substrate temperature less than about 200° C. The Ta layer is comprised of alpha phase Ta. The Ta layer is preferably comprised of alpha phase Ta and beta phase Ta. According to another embodiment, a metal layer, preferably a Cu layer is formed over the Ta layer.

In another non-limiting example embodiment, in a pre-cooling step prior to a Ta sputtering step, we cool the substrate to a temperature less than about 200° C.

In another non-limiting example embodiment, a pre-clean step comprising an inert gas sputter performed prior the tantalum sputter.

Another non-limiting example embodiment of the invention provides a semiconductor structure comprising: a semiconductor structure; a copper layer over the semiconductor structure; a tantalum layer on the copper layer; the tantalum layer comprised alpha phase Ta; a metal layer on the tantalum layer.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A first non-limiting example embodiment of the invention is a process to form Ta films comprised of Alpha phase Ta on a copper (Cu) surface at a low temperature.

A second example non-limiting embodiment describes a pre-clean step (e.g., Ar sputter) of the Cu surface prior to the tantalum sputter and a process to form Ta films comprised of Alpha phase Ta on a copper (Cu) surface at a low temperature.

The first embodiment is a process that forms an alpha phase Ta on a Cu surface at a low temperature where the Cu does not require a pre-clean step. During the Ta sputter the substrate temperature is preferably 200° C. or lower. A preferred step in an embodiment is the cooling step (e.g., between 20 and 100° C.) before Ta layer (comprised of alpha Ta) deposition. The embodiment does not require a seed layer (e.g., TaN) to form Alpha Ta).

A second example non-limiting embodiment describes a pre-clean step (e.g., Ar sputter) of the Cu surface prior to the tantalum sputter. The second example non-limiting embodiment includes a Cu pre-clean step (e.g., Ar sputter clean) if the Cu surface is not "fresh".

Figure 6:
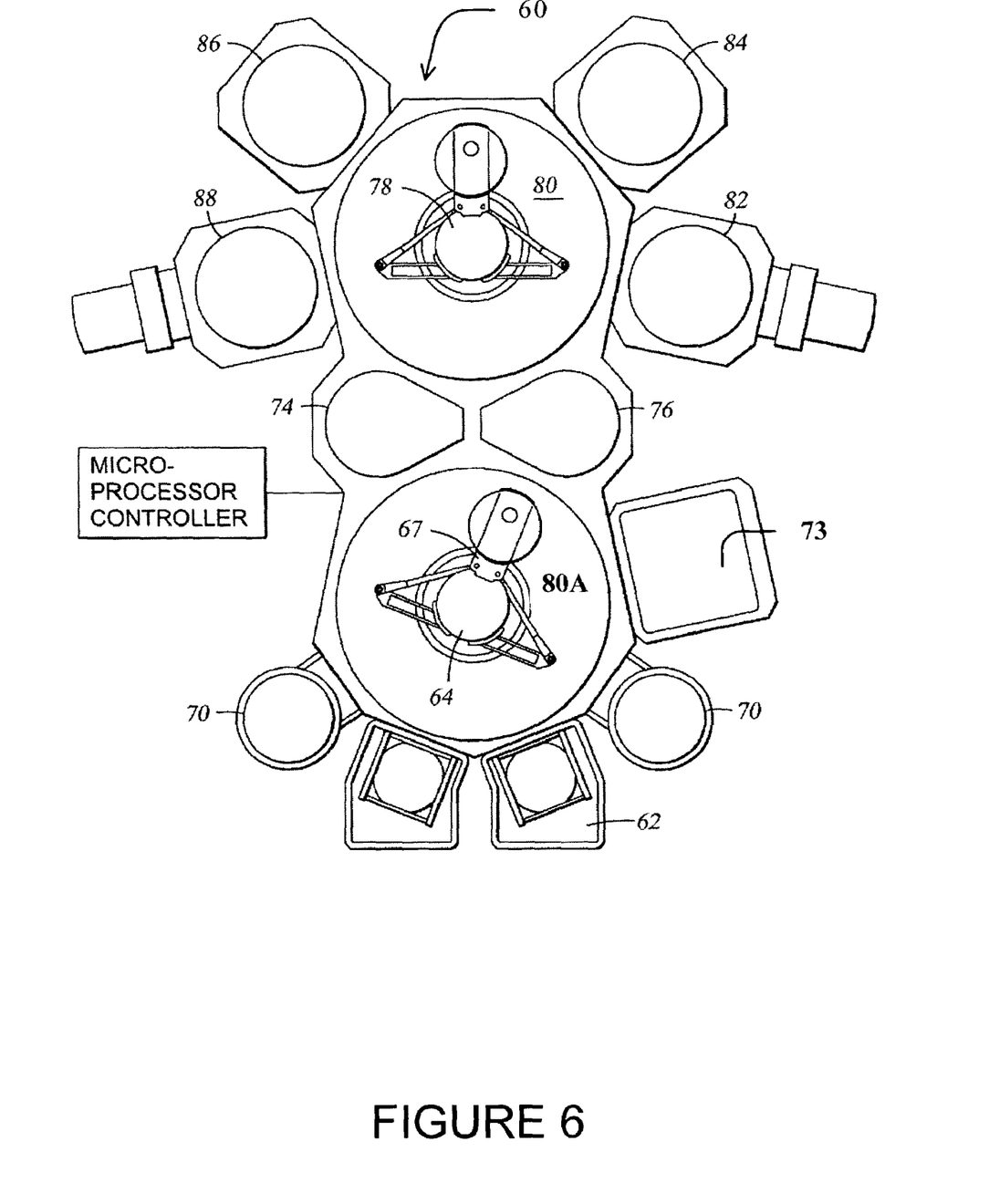
FIG. 6 is a diagram of example equipment that can be used to form a Ta layer according to an embodiment of the invention.

An example of a tool that the embodiments can be performed on is shown in FIG. 6 and explained further below.

I. First Example Embodiment of the Invention

The first embodiment is a process that forms a Ta layer comprised of Alpha phase Ta and beta phase Ta on a Cu surface at a low temperature.

A preferred step in the process is the pre-sputter cool step that cools the substrate and Cu surface down from a temperature above 100° C. (e.g., >350° C.) to a temperate below 100° C. and preferably to a temperature between 20 and 100° C., prior to and during the Ta sputter deposition.

An example of a process for the first embodiment is a process is comprised of the following steps: Degas→Cu dep (fresh Cu)→cool→degas→pre-Ta sputter cool→Ta deposition (e.g., alpha phase)→cool→Cu deposition.

Below is an example embodiment of the process is shown in the table and described.

TABLE 1

Summary of process steps - alpha Ta on a fresh Cu layer

| STEPS | Preferred Temperature ranges |
|---|---|
| provide a Cu surface | |
| transfer wafer to Degas chamber | |
| degas step | T from starting at about 20° C. and rising to about 350° C. |
| transfer wafer to cooling chamber | T from 350 cooling to about between 210 and 240° C. |
| pre-sputter cool step T < 200° C. | ending T below 200° C. |
| transfer wafer to Ta sputter chamber | T ~80° C. to 200° C. |
| Ta sputter - to form Ta layer comprised of alpha phase | T below 200° C. and preferably from 80 to 100° C. |
| transfer wafer to post-sputter cooling chamber | |
| cool wafer | T from ~100 to ~30° C. |

The process is described below with respect to the pro- cessed being performed in a multi-chamber tool or inte- grated cluster tool. Examples of integrated cluster tools are Endura™ Electra Cu™ systems by Applied Materials Corp. USA, or tools by Novellus systems, USA the INOVA™. However, other tools/equipment may be used. An example tool is shown in FIG. 6 and described further below.

Figure 3A:
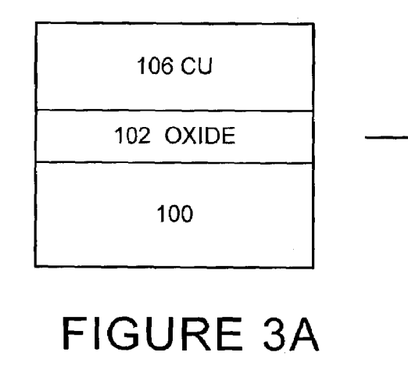
FIG. 3A is a cross sectional view for illustrating a method for forming a Ta layer comprised of alpha phase Ta according to a first non-limiting embodiment of the invention.

As shown in FIG. 3A, we provide a semiconductor structure 100 102. The semiconductor structure 100 102 has a top oxide layer 102 over a substrate 100.

To provide a preferably fresh Cu surface to of form an alpha Ta layer upon, preferably the following steps can be performed: degas step, Cu deposition and the Cu surface is kept clean and preferably under vacuum prior to the Ta sputter.

A. Degas Step—Prior to Cu Deposition

Prior to Cu deposition, the wafer is transfer into a degas chamber for a degas step. Wafer is placed on a pedestal. Lamps located on top of the wafer are used to heat up the wafer by radiation. Heating is made by regulating the power to the lamps and the duration of the process. Wafer degas- sing is performed by placing the wafer on a pedestal followed by a multiple step heating (e.g. a two steps process was used). The first step is to ramp up the temperature to the desired temperature and the second step is to maintain at that temperature for a period of time. By controlling power and time of these two steps process, degas at different temperature is made possible. In a preferred process, the desired temperature is 350° C. The first step power is ~60% for ~20 seconds and the second step power is ~40% for ~20 seconds. The environment of the degaschamber is in vacuum of around 10E-6 Torr or lower.

The purpose of degas step is to desorb any possible moisture or weekly adsorbed organic molecules on the wafers surface. This is important to prevent outgassing of wafer surface in the deposition chamber that compromises the quality of the deposited films.

B. Cu Layer Deposition

Next the wafer is transferred into a Cu deposition chamber. The wafer is preferably keep under vacuum and is not exposed to air or contamination.

In the Cu deposition chamber, a copper layer 106 is formed over the semiconductor structure. See FIG. 3A. The copper (Cu) layer is preferably formed by a PVD process. With a sputtered Cu layer, the deposited Cu film can be kept under vacuum and free from possible contamination. PVD sputter can be carried out in the vacuum environment.

Thus, the Cu layer is "fresh" as it begins the following steps (e.g., transferred into a post Cu deposition cool chamber). Fresh means that the Cu surface is essentially free from contamination and CuO.

C. Post Cu Deposition Cool

The wafer is preferably transferred into a post Cu deposition cool chamber. The transfer is preferably performed by a robot blade under vacuum.

After the Cu deposition, the 'fresh' Cu wafer was kept in the cassette. The cassette is maintained under vacuum of at least 100 mTorr. The post Cu deposition cool step is performed to fulfill the software requirement of the integrated cluster tool of cooling wafer before storing wafer in the cassette. This step may not be necessary because Cu deposition chamber was equipped with Electro static chuck (ESC) at temperature less than −20° C. Wafer after Cu deposition will have temperature much less than 100° C. With and without additional cooling should not have any impact to the subsequent alpha Ta formation.

The substrate is preferably cooled by flowing Ar or an inert gas adjacent to the substrate.

The above steps degas, Cu sputter, post Cu deposition cool serve to prepare 'fresh' Cu under vacuum.

D. Degas Step

Next the wafer is transferred in to a degas chamber for a degas step. See above for a description of a preferred degas step. The substrate temperature at the end of the degas step can be over 300° C. and can be between 340 and 360° C.

E. Pre-Ta Sputter Cool Process

The wafer is then preferably transferred into a cooling chamber (e.g., pre-Ta sputter cooling chamber).

In the pre-cooling step, the substrate is cooled from a temperature (T) preferably between 300 and 350° C. to a temperature below or equal to about 200° C. and preferably between 20 and 100° C. and more preferably between 70 and 100° C.

Wafer cooling is preferably performed by placing the wafer on a pedestal or wafer chuck and filling the chamber with Ar gas to a certain pressure setting. Pressure can preferably range from 1.5 to 7 torr and preferably about 2 torr. Heat from the wafer can be conducted away by the Ar gas to the wafer pedestal or by cooling (e.g., cooling water) to the wafer pedestal. The total cooling time is about 30 sec. This will cool the wafer at temperature of above 350° C. to preferably less than 100° C. Electro static chuck cooling is also possible to be used to cool wafer to wafer temperature lower than 100° C. In this case, the substrate is cooled by flowing Ar or inert gas adjacent to the substrate. The electrostatic chuck or ESC is maintained at low temperature by cycling coolant (water or cryogenic coolant) to achieve better heat exchange purpose. The wafer is preferably cooled by cooling water in wafer chuck and/or inert gas flow past the substrate. The cooling of the wafer could be performed in any chamber. For example in-situ in the Ta sputter chamber with the proper tool configuration.

F. Ta Sputter Deposition

Figure 3B:
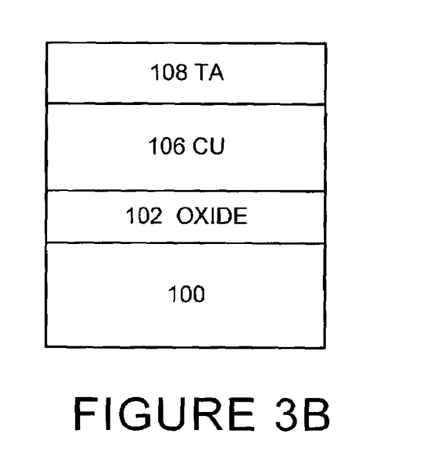
FIG. 3B is cross sectional view for illustrating a method for forming a Ta layer comprised of alpha phase Ta according to a first non-limiting embodiment of the invention.

As shown in FIG. 3B, in the Ta sputtering step, we form a tantalum layer 108 on the copper Layer 106. The tantalum sputter is preferably performed in a Ta sputter chamber. The Ta layer 108 is comprised of alpha phase Ta. The Ta layer 108 is comprised of alpha phase Ta and beta phase Ta.

The Ta sputtering step is preferably performed at a pressure between 1.5 to 8 mTorr; at power between 15 and 24 kilowatts; at Ta deposition rate between 750 and 1200 Å/min; the wafer/substrate temperature is preferably between 20 and 200° C., and more preferably a wafer temperature between 20 and 100° C.

The substrate temperature is preferably maintained by wafer cooling chuck. Contrary to other alpha Ta sputter processes that are performed at high temperatures above 600° C. It is unexpected that the invention can sputter at a temperature well below 600° C. and forms alpha Ta because of low sputter Temperature, (e.g., the pre-cool step) and on 'fresh' copper surface.

The Ta layer preferably has a resistivity between 90 to 110 micro-ohm-cm.

The Ta layer is preferably comprised of alpha phase Ta with between 35 and 50 wt % and Beta phase Ta wt % between 50 and 65.

In contrast to current technology, the inventor's think that is it important to have a substrate temperature below 200° C. and more preferably below 100° C. because at temperatures greater than 200° C. the lattice mismatch between the (002) Beta-Ta and Cu become more pronounced and some preference is given to (100) alpha Ta for a competitive growth of the two crystals.

G. Post Ta Sputter Cool Step

After the Ta sputter, the wafer is preferably transferred to a cooling chamber and cooled preferably by an Ar gas flow. The post sputter cooling is an optional step.

H. Cu Formed over Ta Layer

After the Ta barrier layer is formed, a metal layer such as a Cu layer is formed over the Ta barrier layer preferably to form an interconnect. (For example, metal layer 34 as shown in FIG. 2C.).

The Cu layer preferably is comprised of PVD copper of typically in the thickness range of 700 to 2000 A followed by an electroplated Cu of 0.5 to 1.8 um thick. After Cu deposition, an anneal step and CMP (Chemical mechanical polish) processes are preferably performed to make a structure like FIG. 2C.

The embodiment has several advantages over conventional Ta sputter processes.

First, the Ta layer can be formed directly on Cu surface, without an underlaying layer of TaN layer. The fresh copper is the key step in these embodiments. Oxidized copper surface may prevent alpha Ta formation.

Second, the Ta layer can be sputtered at low temperature (between 25 and 200° C.) in contrast with high temperature alpha phase Ta sputter processes at >600° C. When a Cu interconnect is exposed to a temperature of greater than 400° C., via yield will drop significantly, and thermal stress induced via voids would become serious issue. With high temperature (>400° C.), most low-k dielectrics film properties will also be greatly degraded. Therefore, a lower temperature sputtering, rather than >600° C., has more advantage in terms of the Cu interconnect integration.

Furthermore, (body-centered-cubic) alpha-Ta is a preferred choice, because its bulk resistivity (12-60 micro-Ohm-cm) is much lower than that of metastable tetragonal beta-Ta (170-210 micro-Ohrn-cm). Since beta-Ta is a common resultant phase on most substrates, attempts have been devoted to control the formation of alpha-Ta, which includes using TaN, Ti, Al and Cr underlayers, bias sputtering, high substrate temperature (>600° C.), high-temperature anneal, stress relaxation, and impurity effects. This embodiment does not require a seed/barrier layer under the Ta layer.

In this embodiment, a mixed phase of alpha Ta and beta Ta are formed. Beta-Ta lattice (002) distance mismatching with Cu (111) becomes more pronounced and (110) alpha Ta crystalline growth becomes competitive to the (002) Beta Ta formation on a cooler substrate.

II. Second Example Embodiment of the Invention

The following is a description of a second embodiment of the invention, a process for alpha phase Ta. The second embodiment forms a Ta layer comprised of alpha Ta on a Cu surface that is pre-cleaned before Ta sputter. The Cu surface can be a "not fresh" Cu surface (e.g., Cu surface with CuO and/or contaminates). If the Cu surface is not fresh, a pre-clean step can be used to prepare the Cu surface (e.g., make the surface "fresh") prior to alpha phase Ta deposition.

The process for the second embodiment (Ta on "not fresh Cu") is similar to the first embodiment as described above with the addition of a pre-clean (e.g., Argon (Ar) sputter ) before the Ta Sputter. For example, a process for the second embodiment can comprise: (Degas→pre-Ta sputter cool→pre-clean (e.g., Ar sputter)→Ta deposition→Cu deposition→cool).

For example, a semiconductor structure with a Cu surface is provided. The Cu surface is not "fresh". For example, the Cu surface has been exposed to air.

The structure could then undergo the process steps described above: transfer to degas chamber, degas step, transfer to cooling chamber, pre-sputter cool step, and transfer to a tantalum sputter chamber.

A Cu film can become contaminated or "not fresh" when the Cu layer is exposed to air or process steps, such as CMP or RIE etching. A Cu film is not fresh when a CuO layer is formed or the surface is contaminated.

A. Pre-clean

The copper surface is preferably cleaned, preferably using an Ar sputter in an ICP type pre-clean chamber. In a pre-cleaning step, we pre-clean the Cu layer preferably using a sputter cleaning process using an inert gas.

The sputter cleaning process preferably uses Ar gas and is preferably performed at a temperature between 20 and 100° C.; at a pressure between 0.3 to 1 mTorr; for time between 6 to 60 seconds and plasma power between 200 and 750 Watts.

Below is a table summarizing preferred steps for the second embodiment.

TABLE 2 process sequence 1 - alpha Ta on a Not fresh Cu layer

| STEPS | preferred Temperature ranges |
|---|---|
| provide Cu surface | |
| transfer wafer to Degas chamber | |
| degas step | T from 20 to 350° C. |
| transfer wafer to cooling chamber | T from 350 to 220° C. |
| pre-sputter cool step T < 100° C. | T from ~220 to ending temp below 100° C. |
| pre-clean - Sputter Clean - e.g., Ar sputter - transfer to Ta sputter chamber | Temp from 80 to 100° C. |
| Ta sputter - to form Ta layer comprised of alpha phase Ta transfer wafer to post-sputter cooling chamber | T from 80 to 100° C. |
| cool wafer | T from 120 to 30° C. |

After the preclean step, the wafer can be transferred into a Ta sputter chamber. The process can continue as described above in the first embodiment with the Ta sputter to form a Ta layer comprised of alpha tantalum.

III. Tools

The embodiments can be performed in cluster tools from Applied Materials, model Endura™ equipped with PVD (SIP, IMP) Ta and Cu. Cluster tool made by Novellus, model Inova™ can also be used. The embodiments are not limited to specific type of tools.

This equipment configuration is merely illustrative and should not be limiting. Referring to FIG. 6, below is an example of wafer transfers where a pre-clean is performed prior to Ta Sputter. A substrate processes in the cluster tool 60 is passed from the cassette loadlock 62 to the buffer chamber 80A where the robot 64 and blade 67 first moves the substrate into degas chamber 70. The substrate may then be transferred to the cool-down chamber 76. After the pre-cool process, buffer robot 64 moves substrate from cool-down chamber 76 to the pre-clean chamber 73. After pre-clean process, the substrate is passed from the buffer chamber 80A to the transfer chamber 80, where the buffer robot 64 first removes substrate from pre-clean chamber 73 and send to passthrough chamber 74. Transfer robot 78 then moves substrate into the transfer chamber 80. Substrate in the transfer chamber 80 is then moved by the transfer robot 78 into the Ta chamber 88, followed by moving into copper chamber 86. After completion of Ta and copper deposition the substrate is then moved back into the transfer chamber 80. Using the transfer robot 78, the substrate is removed from the transfer chamber 80 into the buffer chamber 80A via passing through the cool-down chamber 76. The buffer robot 64 picks substrate from the cool-down chamber 76 back to the buffer chamber 68 and then send the substrate back to the cassette loadlock 62.

IV. EXAMPLES

Figure 2A:
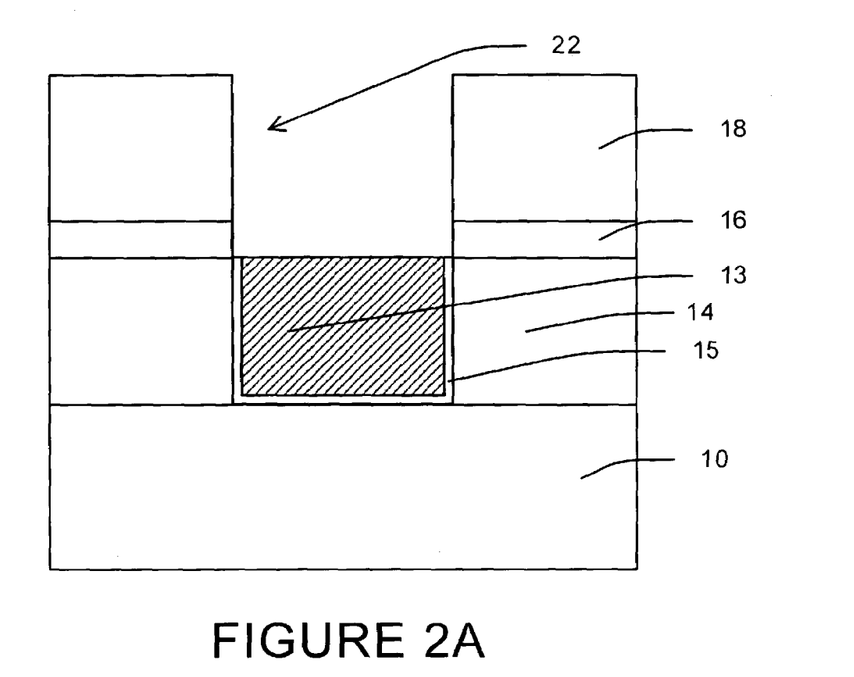
FIG. 2A is a cross sectional view for illustrating a method for forming a Ta layer comprised of alpha phase Ta in an interconnect according a second non-limiting example embodiment of the invention.
Figure 2B:
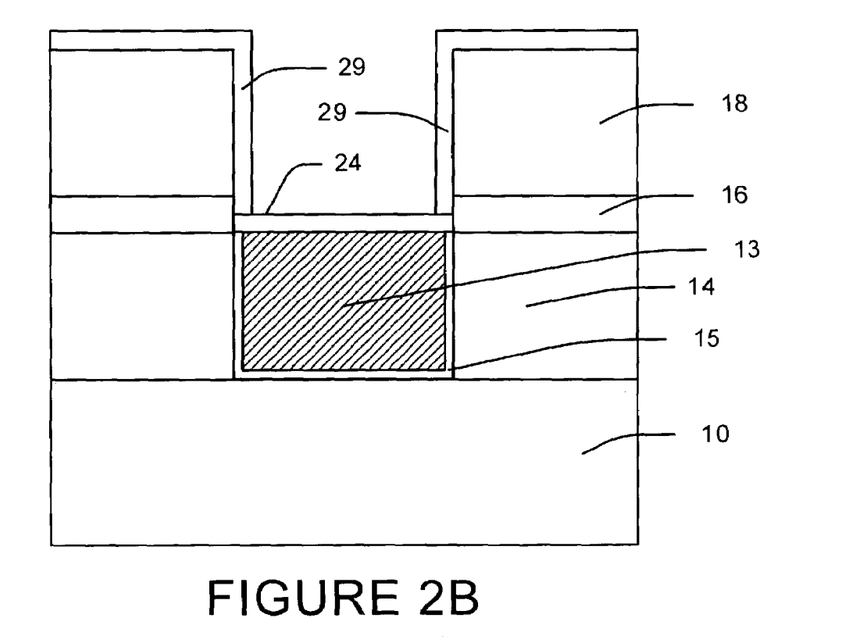
FIG. 2B is a cross sectional view for illustrating a method for forming a Ta layer comprised of alpha phase Ta according in an interconnect to a second non-limiting example of the invention.
Figure 2C:
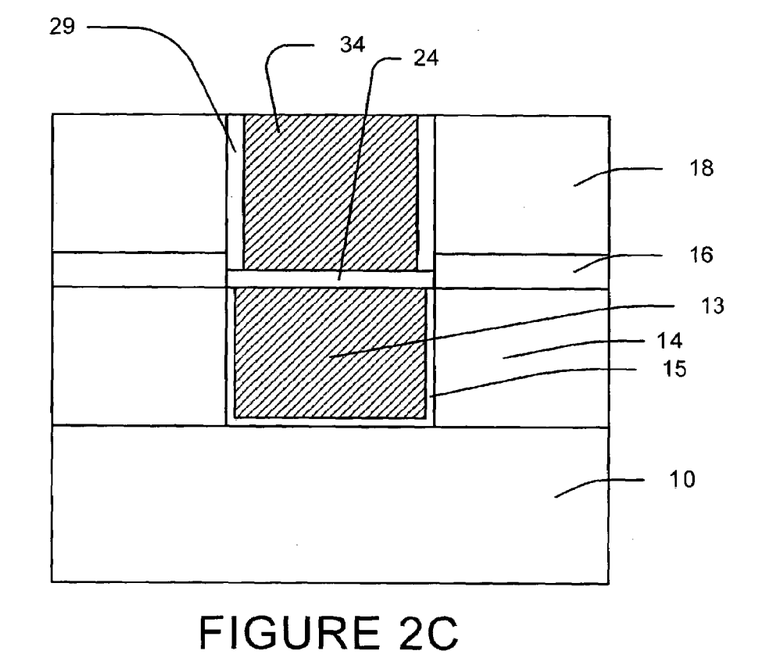
FIG. 2C is a cross sectional view for illustrating a method for forming a Ta layer comprised of alpha phase Ta according in an interconnect to a second non-limiting example of the invention.

FIGS. 2A thru 2C show a structure formed by preferred embodiments of the invention.

As shown in FIG. 2A, a substrate 10 is provided. A first dielectric layer 14 such as oxide layer is formed over the substrate.

A hole/trench in the dielectric layer is formed by single or dual damascene methods.

A copper layer 13 (e.g., Metal feature) is formed filling the opening. The copper layer can be formed by a deposition and chemical-mechanical polish (CMP) (e.g., Damascene process).

A barrier layer (or etch stop layer) 16 is formed over the dielectric layer 14 and the copper layer 13. The buffer layer can be comprised of oxide, nitride, or carbide.

A second dielectric layer 18 is formed over the copper layer 13 and the barrier layer 16.

Still referring to FIG. 2A, an opening 22 in the second dielectric layer 18 and the barrier layer 16 is formed to expose the copper layer.

A barrier layer (24 29) is formed on the copper layer 13 and sidewalls in the opening 22 and the second dielectric layer 18. The barrier layer 24 29 is preferably formed using the second embodiment of the invention (e.g. Including the pre-sputter clean step—Ar sputter) as described above. The barrier layer 24 29 is comprised of the first section 24 on the copper layer 13 and a second section 29 on the second dielectric layer 18. The first section of the barrier layer is comprised of alpha and beta tantalum. The first section 24 preferably has an alpha phase Ta concentration between 35 and 50 wt % and preferably has a beta phase Ta wt % between 50 to 65 wt %.

The second section 29 consists essentially of beta phase Ta. The barrier layer over the dielectric layer forms beta phase Ta.

As shown in FIG. 2C, a metal layer 34 can be formed filing the opening 22. The metal layer 34 is preferably comprised of PVD Cu seed and electrochemical plated Cu or a Cu alloy. Preferably, after metal layer 34 is formed, a chemical-mechanical polish (CMP) process is used to remove the excess metal 34 and the excess barrier 29 over the second dielectric layer 18. The end result is shown in FIG. 2C.

The metal layers 13 and 34 can be interconnects (such as damascene or dual damascene Interconnects) in a semiconductor device. The first dielectric layer could be any level of interlevel dielectric or inter metal dielectric.

V. Comparison of Processes

Below is a table with a summary of two embodiments of the invention and a third process (e.g., process A) known by the inventors. Process "A" is used as a comparison and process "A" only forms beta phase Ta. Process A was used in experimentation to compare with the embodiments of the invention. Process A is not prior art.

TABLE

Summary of process steps of the embodiments and Process A

| First embodiment (No pre-clean step) | Second embodiment (includes pre-clean step) | Process A - known to the inventors - Forms Beta phase Ta |
|---|---|---|
| Fresh Cu | Cu dep other steps | Cu dep |
| place wafer in process tool degas | place wafer in process tool degas | place wafer in process tool degas |
| pre-cool T < 100° C. | pre-cool T < 100° C. | Water T ~350° C. |
| | pre-clean (Ar sputter) | pre-clean (Ar sputter) |
| Ta sputter - to form alpha phase Ta at T <= 100° C. | Ta sputter - to form alpha phase Ta at T <= 100° C. | Ta sputter - to form beta phase Ta at T > 200° C. |

A. Process A—Forms Beta Phase TA

The following is a process "A", which is known to the inventors. Process A is not prior art. This process A forms beta phase Ta (beta Ta) which has a higher resistivity than alpha phase Ta (Alpha phase). Process A was used to by inventors in their work to develop the preferred embodiments of the invention. Process A shows that without the invention's pre-Sputter cool down step, Beta phase Ta is formed.

Figure 1A:
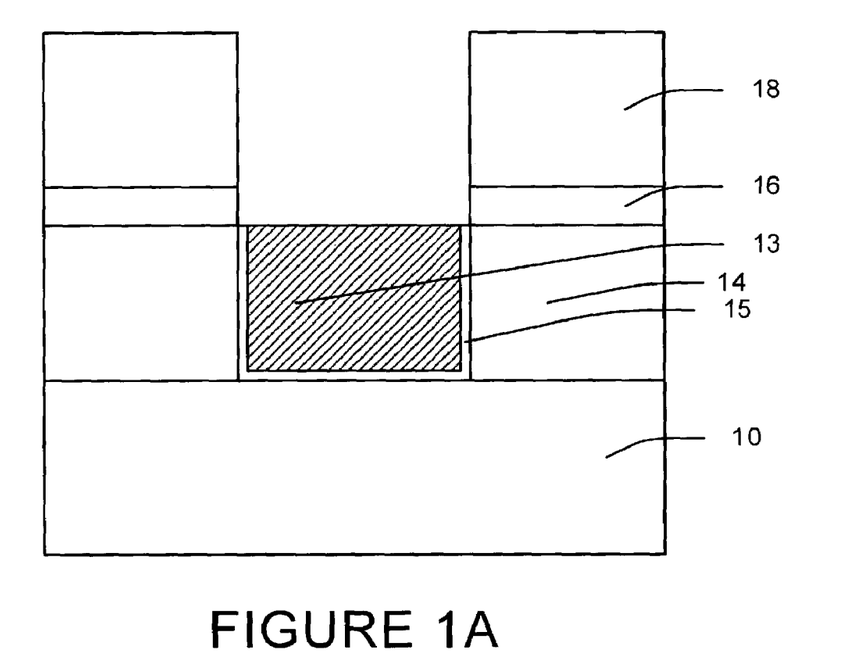
FIG. 1A is cross sectional view for illustrating a method for forming Beta phase Ta in an opening according to a process known to the inventors. This is not prior art.
Figure 1B:
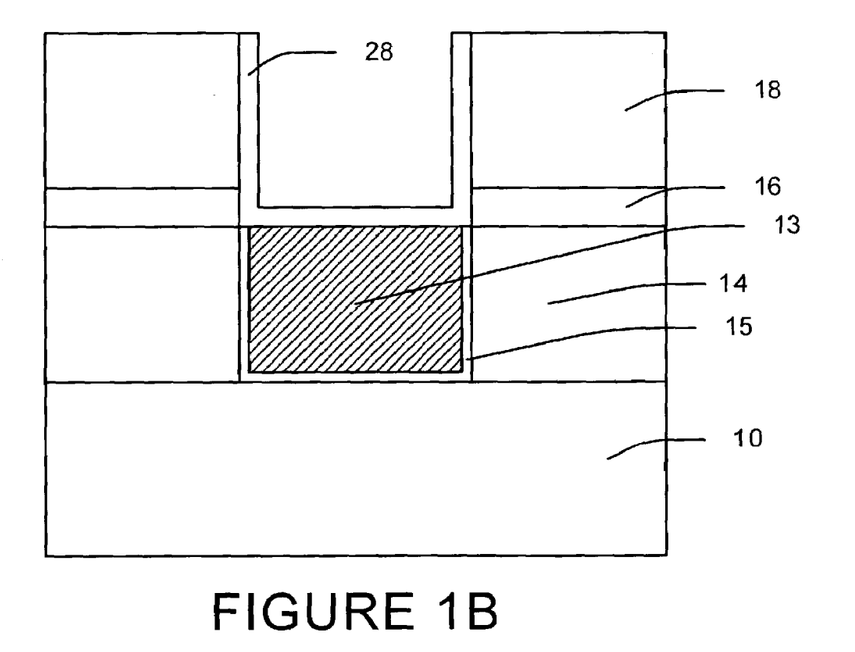
FIG. 1B is cross sectional view for illustrating a method for forming Beta phase Ta in an opening according to a process known to the inventors. This is not prior art.

FIGS. 1A and 1B show the process steps. FIG. 1A is the same as FIG. 2A.

As shown in FIG. 1A, a substrate 10 is provided. A first dielectric layer 14 such as oxide layer is formed over the substrate.

A hole/trench in the first dielectric layer is formed preferably by single or dual damascene methods.

Preferably a barrier layer 15 is formed along this hole/trench. The barrier layer 15 can consist of beta phase Ta only. The barrier layer can be formed by physical vapor deposition (PVD).

A copper layer 13 (e.g., metal feature) is formed on top of barrier layer 15, filling the opening. Next, preferably a chemical-mechanical polish (CMP) process is used to remove any excess barrier layer and copper layer over the first dielectric layer 14 thereby leaving the barrier layer 15 on the sidewall of the hole/trench and copper 13 filling the opening.

A barrier layer (or etch stop layer) 16 is formed over the dielectric layer 14 and the copper layer 13. The buffer layer can be formed of oxide, nitride, or carbide.

A second dielectric layer 18 is formed over the copper layer 13 and the barrier layer 16.

Still referring to FIG. 1A, an opening 22 in the second dielectric layer 18 and the barrier layer 16 is formed to expose the copper layer.

As shown in FIG. 1B, Ta layer 28 consisting of essentially beta phase Ta is formed over the Copper layer 13 and the oxide layer 18. The Ta layer 28 and Cu seed 31 are formed by the following steps:

TABLE

Summary of Process "A"

| Summary of Process "A" steps | Temperatures |
|---|---|
| 1. degas - | temp between 20 and 350° C. |
| 2. transfer to Buffer chamber | T between 350° C. and 220° C. |
| 3. pre-clean (Ar sputtering) | T between 220 and 300° C. |
| 4. transfer in transfer chamber | T between 200 to 210° C. |
| 5. Ta deposition - This forms beta Ta, not alpha Ta | T between 210 and 260° C. |
| 6. Cu deposition | |

A disadvantage of this process is that essentially no alpha phase Ta is formed and high resistivity Beta phase Ta is formed.

The above process was performed on a tool by Applied Material, USA, model Endura.

On most commercial PVD deposition tool, deposition of single material Ta always form Beta Ta. Alpha phase Ta can be formed in a bi-layer method, where a first layer (seed layer) of TaN is deposited followed by a Ta Layer.

In contrast, the first embodiment and second embodiment form a Ta layer comprised of alpha Ta.

B. Structure for an Interconnect Using the Ta Barrier Layer

Figure 4:
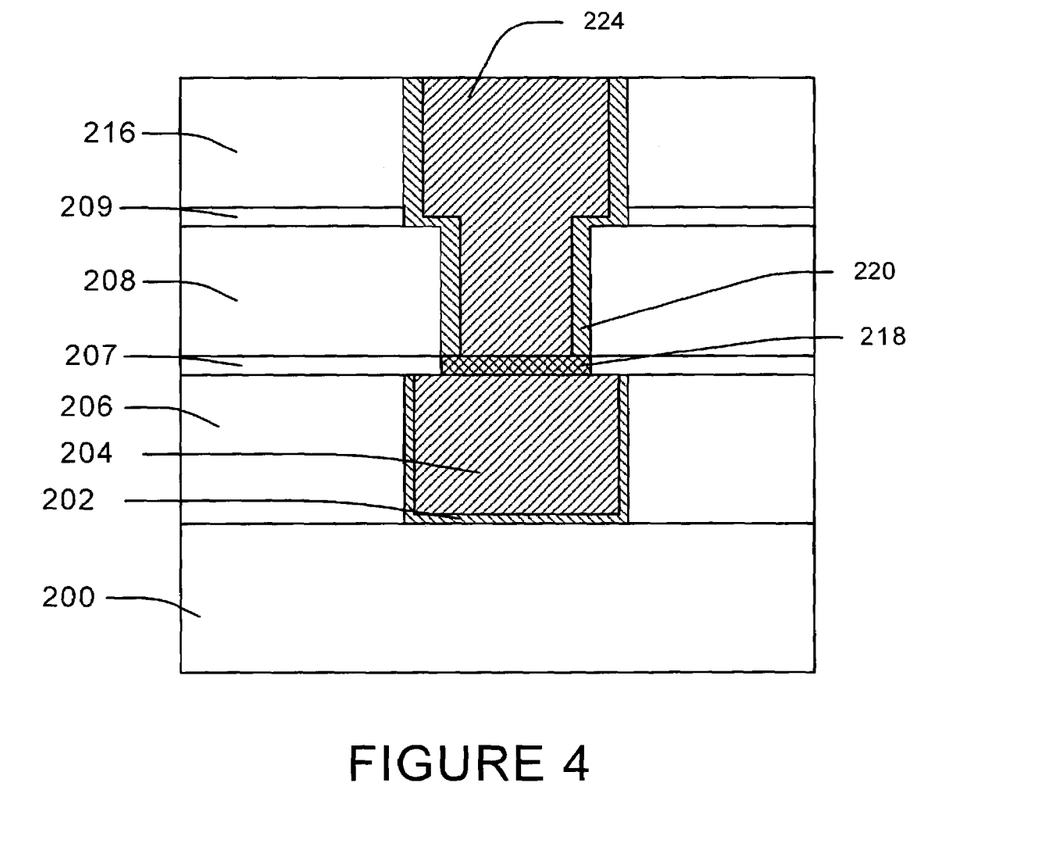
FIG. 4 is a cross section view for illustrating a method and structure for forming a Ta layer comprised of alpha phase Ta according to another embodiment of the invention.

FIG. 4 shows an exemplary structure of the embodiments barrier layer in an interconnect structure. A semiconductor structure 200 is provided. A metal line or interconnect or feature 204 and dielectric layer 206 are provided over the structure. The metal feature is preferably comprised of Cu. A barrier layer 202 is provided. Dielectric layers 208 216 and etch stop layers 207 209 (e.g., SiN) are formed over the metal feature 204 and dielectric layer 206. The embodiment(s) barrier layer 218 220 is formed on the metal feature 204 and over the dielectric layer 208 216. The section of the barrier layer 218 adjacent the metal 204 is comprised of alpha phase Ta and the section on the dielectric layers 208 216 is comprised of beta phase Ta. An interconnect 224 is formed over the barrier layer 220 216. The interconnect is preferably comprised of Cu. After the metal layer deposition, the metal layer can be chemical-mechanical polished (CMP). The interconnect can be a dual damascene interconnect made using a dual damascene process.

C. Other Structures

Figure 5:
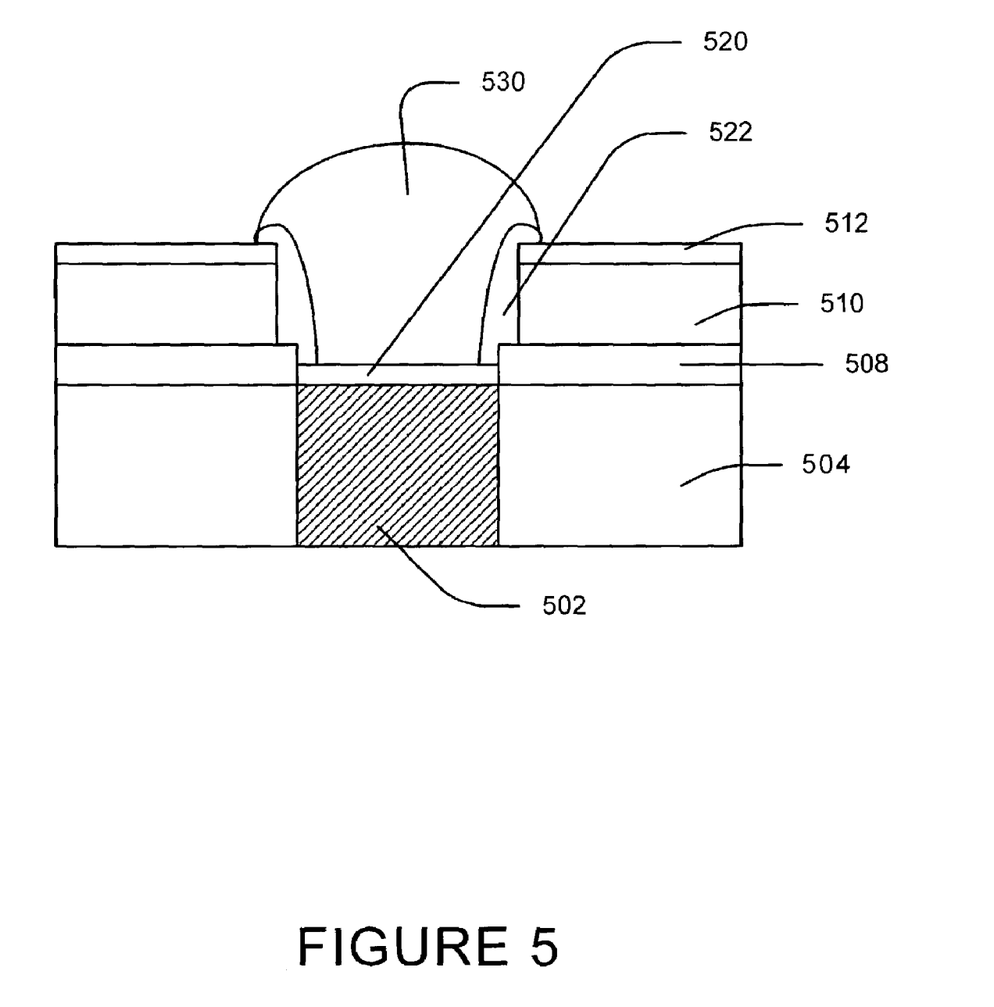
FIG. 5 is a cross section view for illustrating a method and structure for forming a Ta layer comprised of alpha phase Ta according to another embodiment of the invention.

The embodiments Ta layer can be used in other semiconductor applications. For example, the alpha Ta layer be used as a barrier layer in a Cu stud process. FIG. 5 shows a metal feature 502 comprised of Cu. The metal feature is surrounded by dielectric layer 504.

An insulating layer 508 is formed over the dielectric layer 504 and metal feature 502. The insulating layer 508 can be comprised of an oxide/nitride layer.

A polyimide layer 510 is formed over the insulating layer 508.

A passivation layer 512 is formed over the insulating layer 508. The passivation layer 512 can be comprised of nitride.

An opening (e.g., recess) is formed through the insulating layer 508, polyimide layer 510 and passivation layer 512 to expose the metal feature 502.

A Ta barrier layer 520 522 is formed on the metal feature 502 and the sidewalls of the insulating layer 508, polyimide layer 510 and passivation layer 512. The first section of the barrier layer 520 on the Cu metal feature is comprised of alpha Ta and beta Ta. The second section of the barrier layer 522 is comprised of beta Ta and preferably consists of essentially of 100% beta Ta. The Ta barrier layer is formed by the above described embodiments of the invention.

A second metal feature 530 is formed on the barrier layer 522. The second metal feature 530 can be a solder ball or C4 interconnect comprised of lead-tin or any other suitable metals. A lift off process can be used to form the second metal feature.

The embodiments can be used to form interconnects of any kind where there is a Cu layer and a Ta layer, such as, dual damascene interconnects, chip bonds, solder balls, etc.

D. Supporting Data

Figure 7:
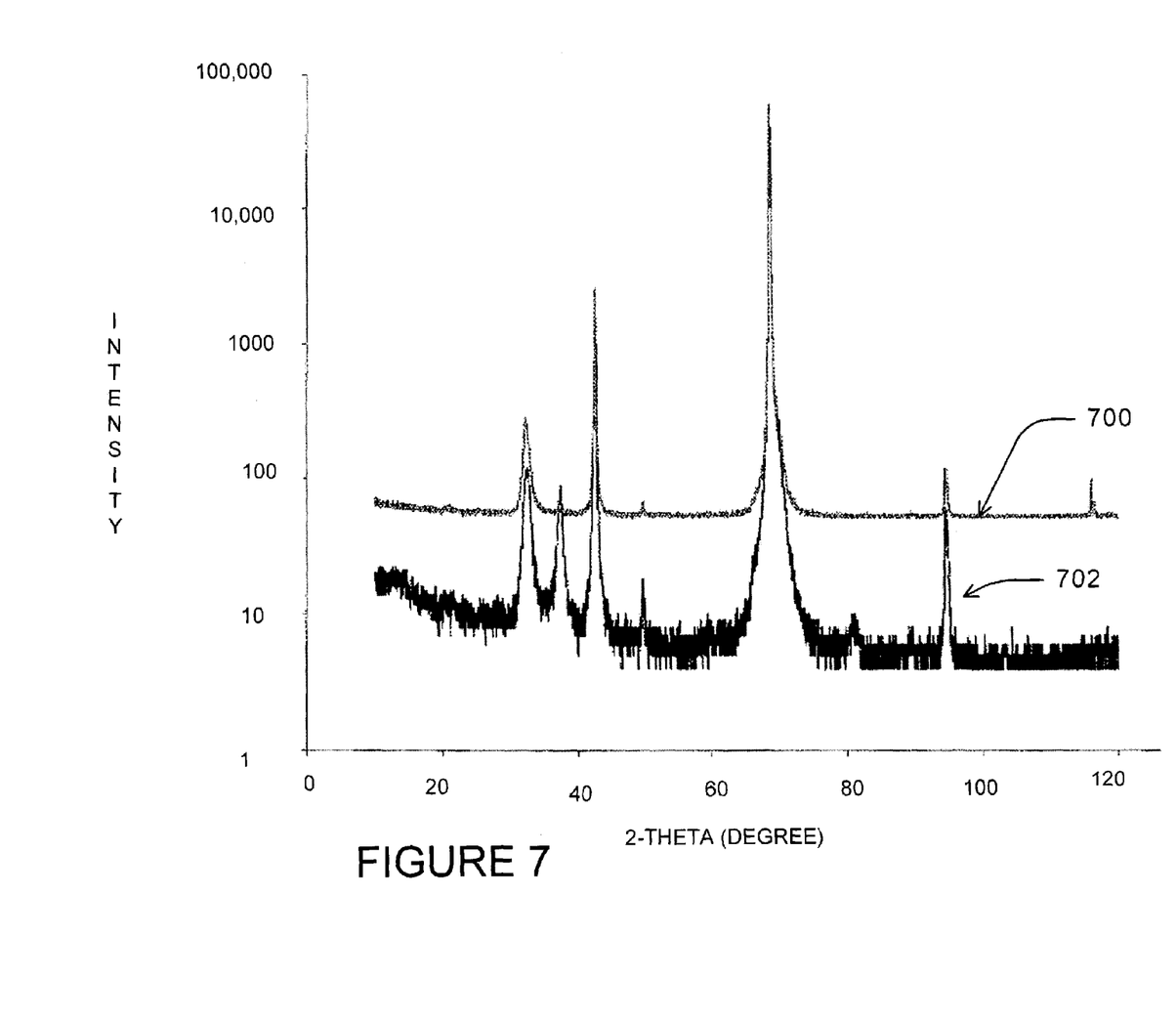
FIG. 7 is a chart of XRD (X-ray diffraction) two theta scan spectra (vs intensity a.u.) that compare films produced using process A (700) with the first embodiment process (702).

FIG. 7 is the XRD (X-ray diffraction) two theta scan spectra (vs intensity a.u.) that compares Ta formed with process A (700) and Ta formed with a first embodiment process (702). For the first embodiment process curve 702, the additional peak located at 38.51 degree is due to the present of alpha phase Ta.

Figure 8:
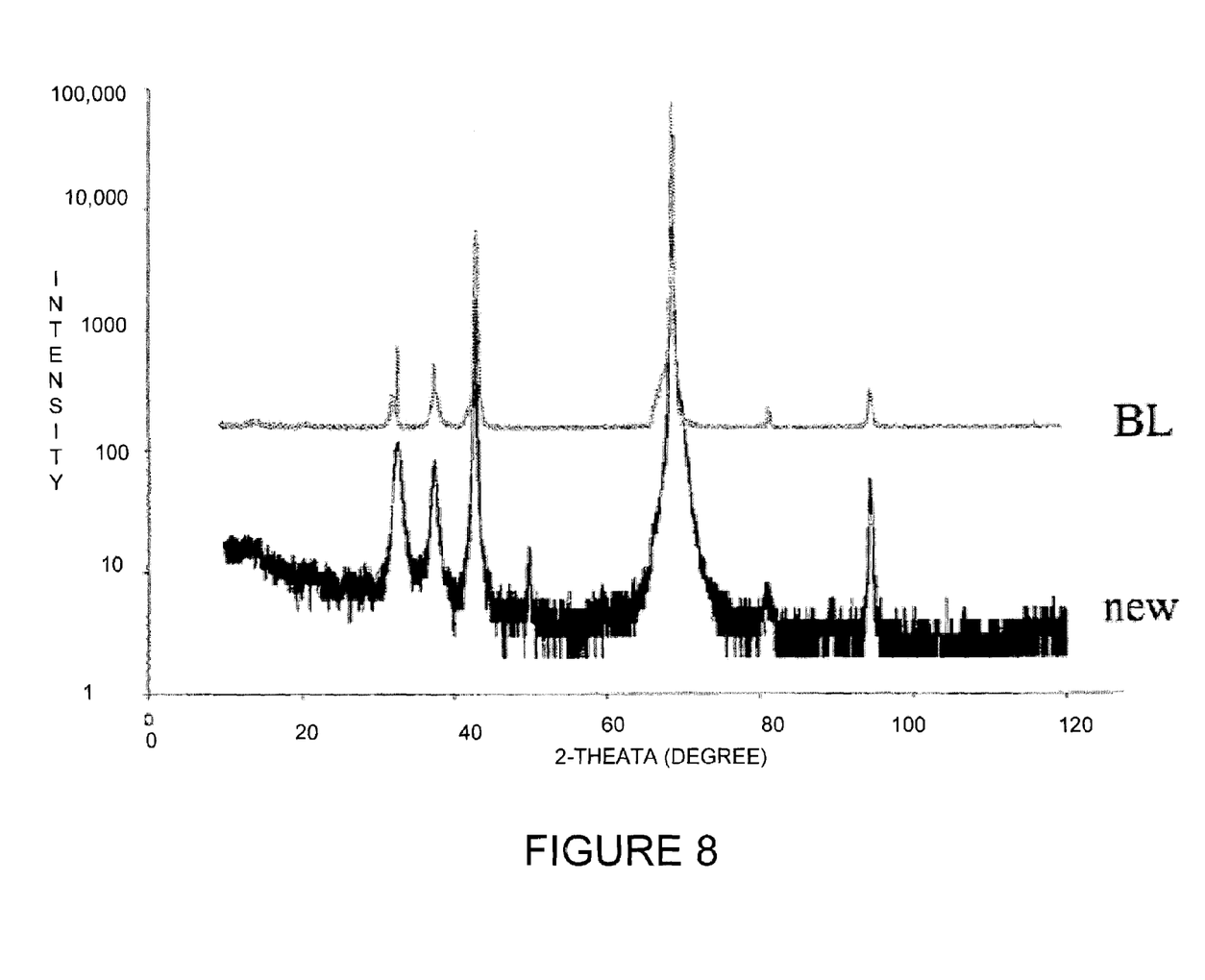
FIG. 8 is the XRD two theta scan spectra that compare samples processed with first embodiment versus that with a TaN/Ta bi-layer process.

FIG. 8 is the XRD two theta scan spectra that compare samples processed with first embodiment (NEW) versus that with the TAN/Ta bi-layer process (BL). Both XRD spectra show the present of characteristic alpha Ta peak located at 38.51 degree. The TaN/Ta bi-layer barrier deposition process comprised (Degas→pre-clean→TaN deposition→Ta deposition→Cu deposition→cool). The first embodiment process comprised: (Degas→Cu dep (fresh Cu)→cool→degas→pre-Ta sputter cool→Ta deposition (e.g., alpha phase)→cool→Cu deposition).

Figure 9:
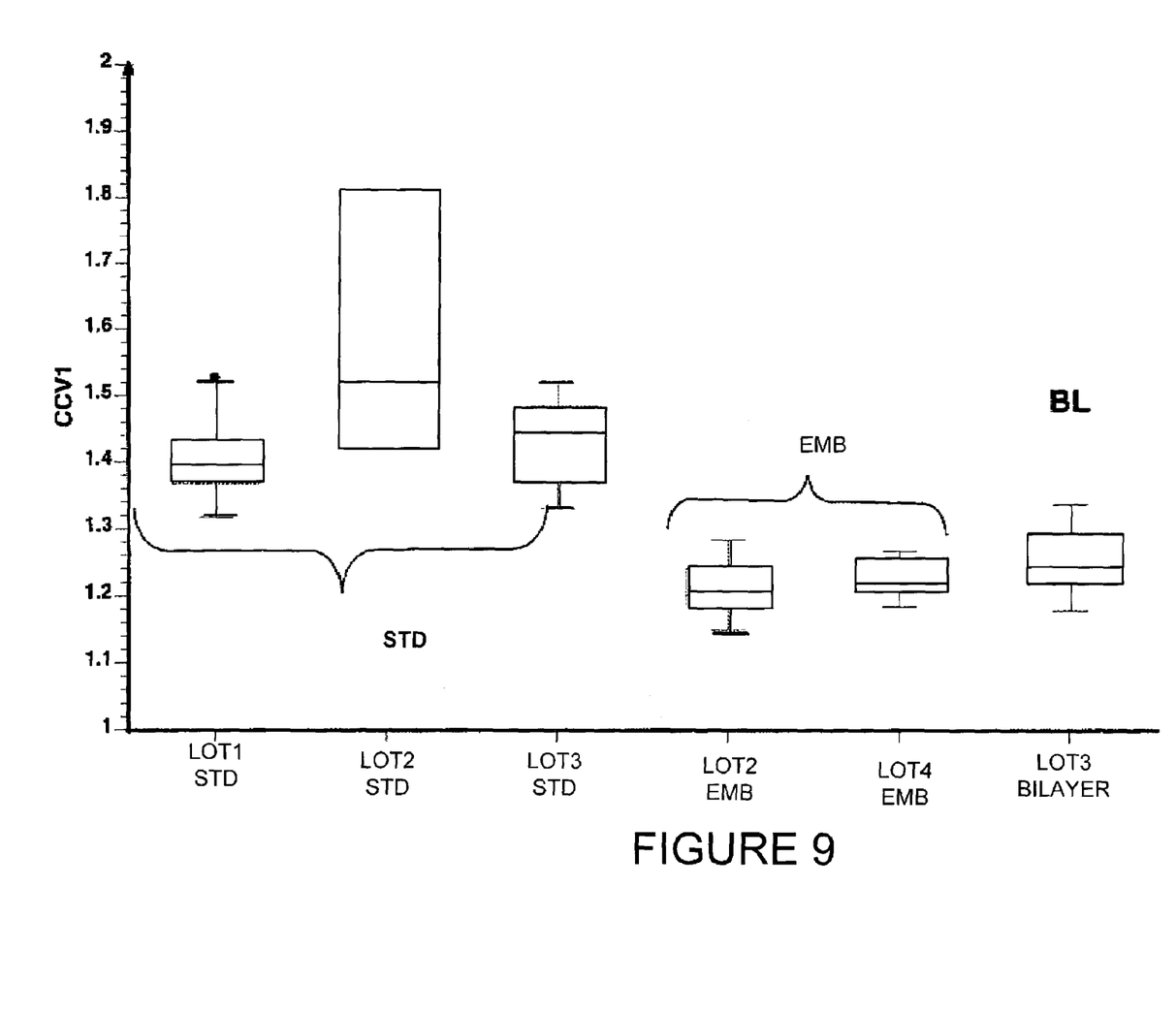
FIG. 9 is a graph of via chain resistance value (CCV1) is graphed for three cells (STD, EMB, BL).

Referring to FIG. 9, via chain resistance value (CCV1) is graphed for three cells (STD, EMB, BL). FIG. 9 shows electrical data (via chain resistance value (CCV1)) generated with dual damascene structures (Similar to FIG. 4).

Data labeled "Std" are the results for process 'A'. (Degas→pre-clean→Ta deposition→Cu deposition→cool). This is not prior art.

Data labeled "EMB" (embodiment) are the results second embodiment. (Degas→pre-cool→pre-clean→Ta deposition→Cu deposition→cool).

Data labeled 'BL' are the results for TaN/Ta bi-layer barrier deposition (Degas→pre-clean→TaN deposition→Ta deposition→Cu deposition→cool). TaN/Ta Bi-layer deposition is the deposition of TaN follows by Ta deposition. It is known that alpha phase Ta can form on top of TaN seed layer. Referring to FIG. 9, process A results in higher via resistance. The second embodiment (EMB) has similar via resistance to the bi-layer ('BL') process. This supports that the second embodiment process forms alpha phase Ta which has a lower resistance than beta phases Ta ("STD").

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, and reference to a "plasma" includes a gas or gas reactants activated by an RF glow discharge.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a tantalum layer comprising the steps of:
   a) providing a copper layer over a substrate; said copper layer having an exposed copper surface;
   b) forming a tantalum layer on and in contact with said copper layer using a sputtering process without any intervening TaN layer between the copper layer and the tantalum layer; the sputtering process of the tantalum layer is performed at a substrate temperature less than 200° C.; and
   said tantalum layer is comprised of alpha phase Ta and beta phase Ta.

2. The method of claim 1 wherein the sputtering process of said tantalum layer is performed at the substrate temperature less than 100° C.

3. The method of claim 1 which further includes after step a) and before step (b), in a pre-cooling step, cooling said substrate to a temperature less than 100° C.

4. The method of claim 1 wherein the sputtering process is performed: at a pressure between 1.5 and 8 mTorr; at the substrate temperature between 25 and 200° C.; at a power between 15 and 24 kilowatts; at a plasma density between $1*10^{11}$ and $1*10^{12}$ cm$^{-3}$; and at a Ta deposition rate between 750 and 1200 Å/min.

5. The method of claim 1 which further includes after step a) and before step (b), in a pre-cooling step, cooling said substrate to a temperature less than 100° C.; said pre-cooling step is performed for a time between 20 and 40 seconds and with an Ar backfill pressure between 1.5 and 5.0 torrs.

6. The method of claim 1 wherein said tantalum layer has a resistivity between 90 and 110 micro-ohm-cm.

7. The method of claim 1 wherein said tantalum layer has a concentration of greater than 35 weight % alpha phase Ta.

8. The method of claim 1 which further includes forming a top copper layer over said tantalum layer; said tantalum layer acting as a barrier layer; said copper layer is a metal line or interconnect; said top copper layer is an interconnect; said substrate is a semiconductor substrate.

9. The method of claim 1 which further includes: depositing a solder ball over the tantalum layer.

10. The method of claim 1 wherein prior to the step of forming said tantalum layer, pre-cleaning said exposed copper surface using a sputter cleaning process.

11. The method of claim 1 wherein prior to the step of forming said tantalum layer, pre-cleaning said exposed copper surface using an Ar sputter cleaning process.

12. The method of claim 1 wherein said copper layer is comprised of greater than 99.999 wt % copper.

13. A method of forming a tantalum layer comprising the steps of:
 a) depositing a copper layer over a substrate; said copper layer having an exposed copper surface;
 b) in a post Cu deposition cooling step, cooling said substrate to a temperature between 20 and 100° C.;
 c) in a degas step, placing said substrate in a processing chamber and reducing the pressure in said processing chamber to between $1*10^{-03}$ and $1*10^{-07}$ torr;
 d) in a pre-cooling step, cooling said substrate to a temperature between 20 and 100° C.; and
 e) in a Ta sputtering step, forming a tantalum layer on and in contact with said copper layer without any intervening TaN layer between the copper layer and the tantalum layer; said substrate having a temperature less than 200° C.;
  (1) said tantalum layer has a resistivity between 90 and 110 micro-ohm-cm; and
  (2) said tantalum layer is comprised of alpha phase Ta and beta phase Ta; the wt percentage of alpha phase Ta is between 35 and 50 wt % and the wt percentage of beta phase Ta is between 50 and 65 wt %.

14. The method of claim 13 which further includes: depositing a top copper layer over the tantalum layer; said tantalum layer acting a barrier layer; said copper layer is a metal line or an interconnect.

15. The method of claim 13 which further includes: depositing a solder ball over said tantalum layer.

16. The method of claim 13 which further includes: said pre-cooling step is performed for a time between 20 and 40 seconds and with an Ar back fill pressure between 1.5 and 5.0 torrs; said substrate cooled by flowing Ar gas adjacent to said substrate.

17. The method of claim 13 which further includes: the Ta sputtenng step is performed at a pressure between 1.5 and 8 mTorr; at a substrate temperature between 25 and 200° C.; at a Power between 15 and 24 Kilowatts; at a plasma density between $1*10^{11}$ and $1*10^{12}$ cm$^{-3}$; and at a Ta deposition rate between 750 and 1200 Å/min.

18. A method of forming a tantalum layer comprising the steps of:
 a) forming a copper layer over a substrate; said copper layer having an exposed copper surface;
 b) in a degas step, placing said substrate in a processing chamber and reducing the pressure in said processing chamber to between $1*10^{-03}$ and $1*10^{-07}$ torr;
 c) in a pre-cooling step, cooling said substrate to a temperature between 20 and 100° C.;
 d) in a pre-cleaning step, pre-cleaning said copper layer using a sputter cleaning process using an inert gas;
  (1) said sputter cleaning process uses Ar gas;
 e) in a tantalum sputtering step, forming a tantalum layer on and in contact with said copper layer without any intervening TaN layer between the copper layer and the tantalum layer; the substrate temperature is less than 200° C.;
  (1) said tantalum layer has a resistivity between 90 and 110 micro-ohm-cm;
  (2) said tantalum layer is comprised of alpha phase Ta and beta phase Ta; and said tantalum layer has a wt percentage of alpha phase Ta between 35 and 50 wt % and a wt percentage of beta phase Ta between 50 and 65 wt %.

19. The method of claim 18 which further comprises: depositing a second copper layer over the tantalum layer; said tantalum layer acting a barrier layer; said copper layer is a metal line or interconnect; said second copper layer is an interconnect.

20. The method of claim 18 which further comprises: forming a solder ball over said tantalum layer.

21. The method of claim 18 which further includes: said pre-cooling step is performed for a time between 20 and 40 seconds and with an Ar backfill pressure between 1.5 and 5.0 Torrs.

22. The method of claim 18 which further includes: said sputter cleaning process using Ar gas and is performed at a plasma density of between $1*10^{11}$ and $1*10^{12}$ cm$^{-3}$; at a temperature between 20 and 100° C.; and at a pressure between 0.3 and 1 mTorr.

23. The method of claim 18 which further includes the tantalum sputtering step is performed: at a pressure between 1.5 and 8 mTorr; at a substrate temperature between 25 and 200° C.; at a power between 15 and 24 Kilowatts; at a plasma density between 1E11 and 1E12 cm$^{-3}$; and at a tantalum deposition rate between 750 and 1200 Å/min.

24. The method of claim 18 wherein the exposed copper surface is maintained in a vacuum prior to the tantalum sputtering step.

25. A method of forming a tantalum layer comprising the steps of:
 a) providing a copper layer over a substrate; said copper layer having an exposed copper surface;
 b) forming a tantalum layer on and in contact with said copper layer using a sputtering process without any intervening TaN layer between the copper layer and the tantalum layer; the sputtering process is performed at a substrate temperature less than 200° C.;

said tantalum layer is comprised of alpha phase Ta and beta phase Ta;

said tantalum layer is comprised of beta phase Ta at a concentration of between 50 and 65 weight % and alpha phase Ta at a concentration of between 35 and 50 wt %.

26. The method of claim 25 wherein the sputtering process of said tantalum layer is performed at a substrate temperature less than 100° C.

* * * * *

UNITED STATES PATENT AND TRADEMARK OFFICE
CERTIFICATE OF CORRECTION

| | |
|---|---|
| PATENT NO. | : 7,294,241 B2 |
| APPLICATION NO. | : 10/336271 |
| DATED | : November 13, 2007 |
| INVENTOR(S) | : Seet et al. |

Page 1 of 1

It is certified that error appears in the above-identified patent and that said Letters Patent is hereby corrected as shown below:

Col. 5, Line 9, "degaschamber" should read --degas chamber--.

Claim 17, Col. 14, Line 5, "sputtenng" should read --sputtering--.

Signed and Sealed this

Twenty-fifth Day of March, 2008

JON W. DUDAS
*Director of the United States Patent and Trademark Office*